United States Patent [19]
Fukusho et al.

[11] Patent Number: 5,238,863
[45] Date of Patent: Aug. 24, 1993

[54] PROCESS FOR FABRICATING GATE INSULATING STRUCTURE OF A CHARGE COUPLED DEVICE

[75] Inventors: Takashi Fukusho; Yoshinori Toshmiya, both of Kanagawa, Japan

[73] Assignee: Sony Corporation, Tokyo, Japan

[21] Appl. No.: 880,403

[22] Filed: May 8, 1992

[30] Foreign Application Priority Data

May 10, 1991 [JP] Japan .................... 3-135614

[51] Int. Cl.[5] ............................ H01L 21/76
[52] U.S. Cl. ........................ 437/53; 437/42; 437/920; 148/DIG. 114
[58] Field of Search .............. 437/40, 42, 53, 238, 437/241, 919, 920, 978, 50; 148/DIG. 14, DIG. 43, DIG. 112, DIG. 114

[56] References Cited

U.S. PATENT DOCUMENTS

| | | | |
|---|---|---|---|
| 4,438,157 | 3/1984 | Romano-Moran | 437/920 |
| 4,466,172 | 8/1984 | Batra | 437/42 |
| 4,980,307 | 12/1990 | Ito et al. | 148/DIG. 114 |
| 4,987,091 | 1/1991 | Kotaki | 437/919 |

OTHER PUBLICATIONS

Chao et al., "Characterization of charge injection and trapping in scaled SONOS/MONOS memory devices", Solid State Electronics, vol. 30, No. 3, pp. 307–319, 1987.

*Primary Examiner*—Brian E. Hearn
*Assistant Examiner*—C. Chaudhari
*Attorney, Agent, or Firm*—Hill, Steadman & Simpson

[57] ABSTRACT

A fabrication process includes at least a step of low pressure CVD for depositing an upper silicon oxide layer on a silicon nitride layer which is formed through a lower silicon oxide layer on a silicon substrate, a next step of forming a gate electrode on the second oxide layer, and a further step of selectively removing the second oxide layer and instead forming a similar silicon oxide layer anew. This process can meet the demand for device miniaturization, improve the C-V characteristic of a MOS capacitor and provide uniform insulating layers.

5 Claims, 2 Drawing Sheets

PROCESS FOR FABRICATING GATE INSULATING STRUCTURE OF A CHARGE COUPLED DEVICE

BACKGROUND OF THE INVENTION

The present invention relates to processes for fabricating gate insulating layers and gate insulating structures obtained by the processes, and more specifically to processes of fabricating a gate insulating structure for a charge transfer section, such as a horizontal transfer section or a vertical transfer section, of a solid state image sensor.

In the fabrication of an insulated gate structure in a horizontal or vertical transfer section of a CCD imager, a process step of thermal oxidation to form a gate oxide film is followed by a step of low-pressure CVD to deposit a silicon nitride film ($Si_3N_4$) to improve the withstand voltage. Then, before deposition of a polysilicon electrode, this silicon nitride film is thermally oxidized to form a thin thermal oxide film under the polysilicon electrode. This step of thermal oxidation of the silicon nitride film is interposed to prevent destabilization of the flatband voltage $V_{FV}$ due to B-T bias in the C-V characteristic of the MOS capacitor which would result if the polysilicon gate were deposited directly on the silicon nitride film. This thermal oxide film under the polysilicon gate not only stabilizes the flatband voltage $V_{FV}$, but also improves the etch selectivity relative to the underlying material in patterning the gate electrode.

In the gate insulating layer of the above-mentioned MONOS (Metal Oxide Nitride Oxide Semiconductor) structure, however, the thin oxide layer is formed under the gate electrode by the thermal oxidation of the silicon nitride layer. Therefore, this process has the following disadvantages.

First, the thermal oxidation of silicon nitride requires high temperatures and much time, so that redistribution of impurities and other adverse influences are produced specifically to the disadvantage of device miniaturization.

Second, the thermal oxidation of the silicon nitride film tends to distort the C-V characteristic of the MOS capacitor out of linearity Third, the silicon oxide film ($SiO_2$) on the silicon nitride layer is etched away almost completely during etching of the gate electrode. Therefore, the MOS structures formed by the first electrode layer and the second electrode layer differ from each other in the thickness of the insulating layer, and this difference causes considerable differences in capacitance and potential.

Fourth, the differences in capacitance and potential are further increased when this process is applied to a multilevel structure having three or more metallization layers. During patterning of the second electrode in the second layer, the etching process not only removes the silicon oxide film, but also attacks the underlying silicon nitride layer to such an extent as to further increase the capacitance and potential differences.

Finally, the selectivity to the underlying material becomes worse when the polysilicon gate is replaced by a tungsten silicon electrode. When a process step for covering the tungsten silicon electrode with a silicon nitride film is employed, the silicon nitride film must be thermally oxidized each time a silicon nitride layer is reformed.

SUMMARY OF THE INVENTION

It is therefore an object of the present invention to provide gate insulation structures and fabricating processes which are suitable for device miniaturization, and capable of preventing the MOS capacitor's C-V characteristic from becoming nonlinear, improving the infrawafer and interwafer uniformities and the selectivity to the underlying material in etching of the gate electrode, and achieving a multilayer structure having a plurality of conductive layers alternated with uniform insulating layers.

According to the present invention, a fabricating process (or method) comprises at least a first step of forming a first (lowermost) oxide layer of silicon dioxide on a semiconductor substrate, a second step of forming a nitride layer of silicon nitride on the first oxide layer formed by the first step, a third step of forming a second oxide layer of silicon dioxide on the nitride layer by the low-pressure CVD, a fourth step of selectively forming a first gate electrode on the surface of the second oxide layer, a fifth step of selectively removing the second oxide layer except under the first gate electrode and leaving the second oxide layer under the the first gate electrode, and a sixth step of forming a third oxide layer of silicon dioxide on the first gate electrode and a bared surface of the nitride layer. The process may further comprise a seventh step of selectively forming a second gate electrode on the third oxide layer. At least one portion of the second gate electrode lies on a region without the first gate electrode.

A fabricating process according to another aspect of the present invention comprises a first step of forming a first oxide layer on a semiconductor substrate, a second step of forming a first nitride layer of silicon nitride on the first oxide layer, a third step of forming a second oxide layer of silicon dioxide on the first nitride layer by the low-pressure CVD, a fourth step of selectively forming a first gate electrode on the second oxide layer, a fifth step of thermally oxidizing the surface of the first gate electrode, a sixth step of selectively removing a portion of the second oxide layer except under the first gate electrode, a seventh step of selectively removing a portion of the first nitride layer except under the first gate electrode, an eighth step of forming a second nitride layer on the first gate electrode and the first oxide layer, and a ninth step of forming a third oxide layer of silicon dioxide on the second nitride layer. This process may further comprises a tenth step of selectively forming, on the third oxide layer, a second gate electrode comprising at least a portion lying on a region without said first gate electrode.

DETAILED DESCRIPTION OF THE INVENTION

FIGS. 1A-1F show a fabrication process according to a first embodiment of the present invention.

Figure 1A:
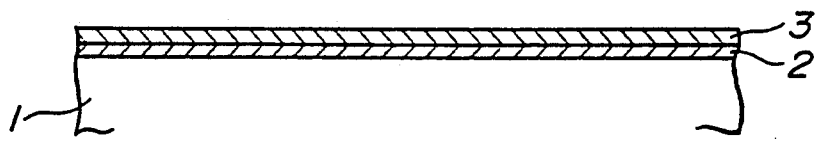
FIGS. 1A~1F are sectional views showing a sequence of steps in a fabricating process according to a first embodiment of the present invention.

In the first embodiment, the process for fabricating a gate insulating structure includes a first step of thermal oxidation for growing a first oxide layer 2 of silicon oxide ($SiO_2$) on a first (top) major surface of a silicon substrate 1 by the thermal oxidation, and a second step of LPCVD for forming a nitride layer 3 of silicon nitride ($Si_3N_4$) on the thermal oxide layer 2 by the low-pressure chemical vapor deposition. As shown in FIG. 1A, the deposited nitride layer 3 is formed on the thermal oxide layer 2 which is formed on the silicon substrate 1.

Figure 1B:
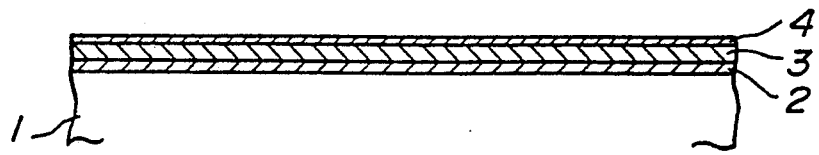

As shown in FIG. 1B, the fabrication process further includes a third step of depositing a second oxide layer 4 of silicon oxide ($SiO_2$) by the low-pressure CVD on the nitride layer 3. The deposited second oxide layer 4 is in the form of a thin film having a thickness of about 100~200 Å. In this step, the second oxide layer 4 is formed on the nitride layer 3 without thermal oxidation of the silicon nitride layer 3. There is no thermal oxide layer between the nitride layer 3 and the deposited second oxide layer 4.

Figure 1C:
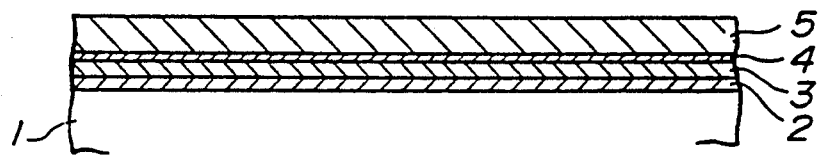

In a fourth step of this fabrication process sequence, as shown in FIG. 1C, a conductive layer 5 is formed on the deposited second oxide layer 4. In this example, the conductive layer 5 is a polysilicon layer, and the fourth step is a deposition step for depositing the polycrystalline silicon layer 5 by the low-pressure CVD.

Figure 1D:
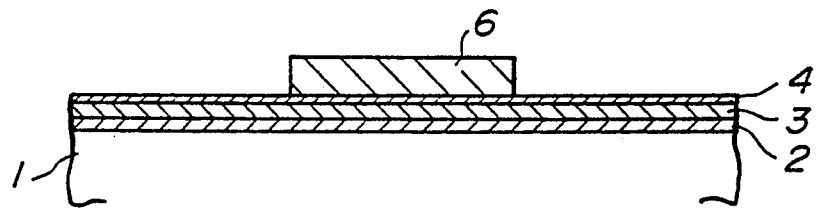
Figure 1E:
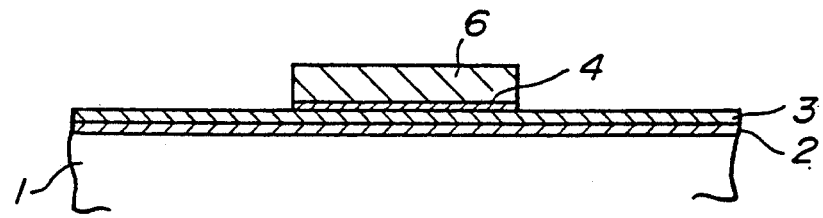

A fifth step is designed to form at least one gate electrode 6 as shown in FIG. 1D. In this example, the gate electrode 6 is formed by patterning the polysilicon layer 5 by plasma dry etching such as reactive ion etching (RIE). In this etching step to form the gate electrode 6, the thickness of the remaining film is largely influenced by the selectivity with respect to the underlying material because of differences of equipments, reproducibility and nonuniformities within a wafer surface and among wafer surfaces. Therefore, in a sixth step shown in FIG. 1E, an exposed portion (or portions) of the second oxide layer 4 is removed by using a dilute solution of hydrofluoric acid. A covered portion of the second oxide layer 4 under the gate electrode (or each gate electrode) 6 is not removed away, but left unetched, as shown in FIG. 1E. The silicon nitride layer 3 is exposed except in an area just under the gate electrode 6.

Figure 1F:
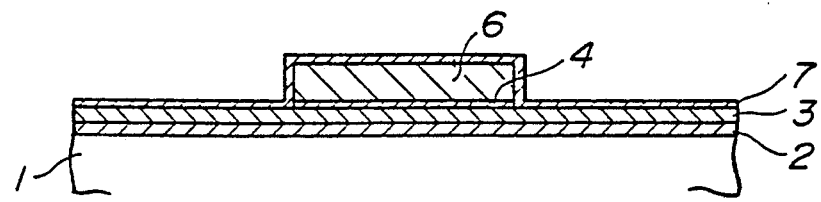

FIG. 1F shows a seventh step of depositing a third oxide layer 7 of silicon oxide ($SiO_2$) to a thickness of about 100~200 Å on the gate electrode 6 and the silicon nitride layer 3 by the low-pressure CVD. The second oxide layer 4 remaining under the gate electrode 6, and the newly deposited third oxide layer 7 are formed by the same method, and equal in thickness.

After the seventh step, thermal oxidation of the polysilicon gate electrode 6 is carried out, and then subsequent process steps follows as in the conventional process.

In this fabrication process according to the first embodiment, the second silicon oxide layer 4 is formed on the silicon nitride layer 3 by the low-pressure CVD instead of the thermal oxidation in the conventional process. That is, the fabricating process of the first embodiment eliminates the necessity of one heat treatment step. This is advantageous particularly when this process is used for forming a gate insulating layer of a MONOS structure in a horizontal or vertical transfer portion of a CCD solid state image sensor. In this case, the elimination of heat treatment prevents the C-V characteristic of a MOS capacitor from deviating from the linearity, and facilitates device miniaturization.

Figure 2:
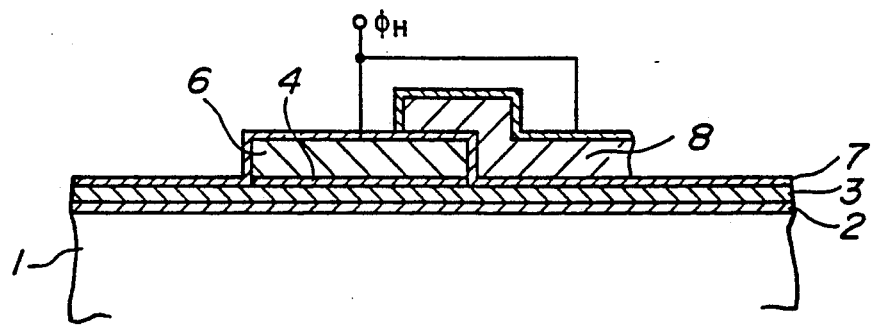
FIG. 2 is a sectional view showing a multilayer gate structure fabricated by utilizing the fabrication technique of the first embodiment of the invention.

In the process of the first embodiment, the second oxide layer 4 is selectively removed, and the third oxide layer 7 is formed anew. This reformation of the third oxide layer 7 helps prevent deterioration of the selectivity relative to the underlying material due to etching of the gate electrode 6, and undesired irregularities. Furthermore, in the fabrication of a multilayer electrode structure, the process of the first embodiment makes it possible to form a MOS structure of a second or subsequent layer which is equivalent in capacity and potential to a MOS structure of a first layer. FIG. 2 shows a two layer structure as an example.

The two layer structure shown in FIG. 2 is attained by adding an eighth step of forming at least one second gate electrode 8, to the fabricating process shown in FIGS. 1A-1F. In this example, the second gate electrode 8 is formed by patterning a polysilicon layer formed on the third oxide layer 7 covering the first electrode 6 in the first layer. In the structure obtained by this process, the second oxide layer 4 under the first gate electrode 6 and the third oxide layer 7 under the second gate electrode 8 are equal in film thickness. Therefore, the MOS capacitor of the second gate electrode 8 is equal in capacitance to the MOS capacitor of the first gate electrode 6. As shown in FIG. 2, the second gate electrode has at least one upper portion formed above the first electrode 6, and at least one lower portion which is formed at the level of the first electrode 6. Between the lower portion (or portions) of the second gate electrode and the semiconductor substrate 1, there exists only the dielectric layers 2, 3 and 7 without intervention of the first gate electrode 6.

Figure 3A:
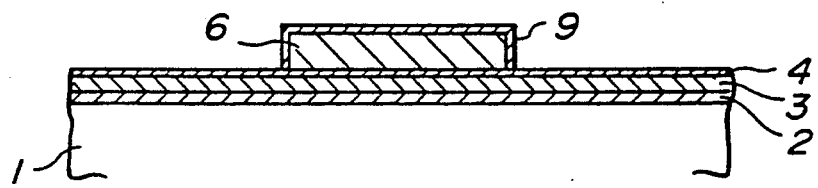
FIGS. 3A~3C are sectional views showing a sequence of steps in a fabricating process according to a second embodiment of the present invention.
Figure 3B:
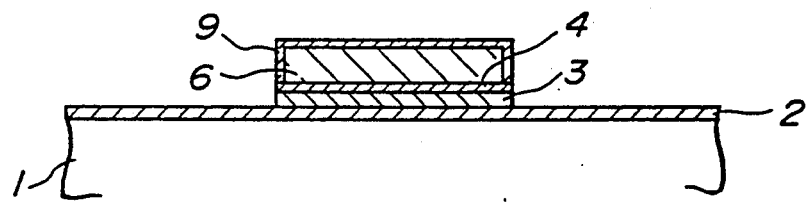
Figure 3C:
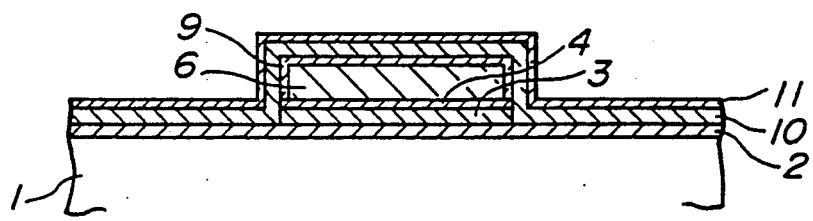

FIGS. 3A-3C show a fabricating process according to a second embodiment of the present invention. The fabrication process according to the second embodiment includes first, second, third, fourth and fifth steps which are substantially identical, respectively, to the first, second, third, fourth and fifth steps of the first embodiment shown in FIGS. 1A~1D. Therefore, a silicon nitride layer 3 is deposited, by the low-pressure CVD, on a first silicon oxide layer 2 on a silicon substrate 1. A second silicon oxide layer 4 is deposited on the nitride layer 3 by the low-pressure CVD, and a gate electrode pattern 6 is formed on the second oxide layer 4, as shown in FIG. 1D.

After the patterning step to form the gate electrode 6, the gate electrode 6 is oxidized to form a third silicon oxide layer 9 as shown in FIG. 3A. The oxidation step shown in FIG. 3A is followed by an etching step of plasma dry etching such as RIE or some other etching technique. In this etching step, not only the second silicon oxide layer 4 but also the silicon nitride film layer 3 is removed by using the silicon oxide layer 9 as a mask, as shown in FIG. 3B.

After the etching step of FIG. 3B, a silicon nitride layer 10 and a silicon oxide layer 11 are formed by the low-pressure CVD, as shown in FIG. 3C. The thickness of the deposited silicon nitride layer 10 is equal to that of the silicon nitride layer 3. The thickness of the deposited silicon oxide layer 11 is equal that of the silicon oxide layer 4. The nitride layer 10 is first deposited, and the oxide layer 11 is deposited on the nitride layer 10.

Figure 4:
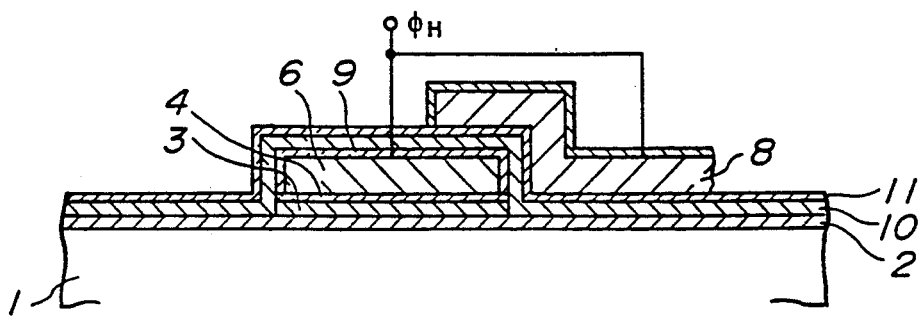
FIG. 4 is a sectional view showing a multilayer gate structure fabricated by utilizing the technique of the second embodiment.

FIG. 4 shows a two layer structure fabricated by the process according to the second embodiment. As shown in FIG. 4, the silicon nitride layer is interposed between the first gate electrode 6 and the second gate electrode 8. This structure can improve the withstand voltage between the first and second gate electrodes 6 and 8.

In the present invention, various metallization choices and other variations are possible. For example, it is possible to employ a metal electrode or a metal silicide electrode in place of each of the polysilicon gates 6 and 8. The silicon oxide layer 4 can be deposited on the silicon nitride layer 3 by the low-pressure CVD under a variety of conditions. The choices of source gases and deposition temperatures are not limited.

What is claimed is:

1. A method of fabricating a gate insulating layer of a charge coupled device having a semiconductor substrate, comprising the steps of:
    applying a first layer of silicon dioxide to said semiconductor substrate;
    applying a layer of silicon nitride to said first layer of silicon dioxide;
    applying a second layer of silicon dioxide to said layer of silicon nitride by low pressure CVD;
    selectively forming a first gate electrode on the surface of said second layer of silicon dioxide;
    selectively removing a portion of said second layer of silicon dioxide except under said first gate electrode;
    applying a third layer of silicon dioxide to said first gate electrode and said layer of silicon nitride by low pressure CVD; and
    selectively forming a second gate electrode on said third layer of silicon dioxide and adjacent to said first gate electrode, a portion of said second gate electrode lying over said first gate electrode.

2. A method according to claim 1 wherein the thickness of said third layer of silicon dioxide is substantially the same as that of said second layer of silicon dioxide.

3. A method of fabricating a gate insulating layer on a charge coupled device having a semiconductor substrate, comprising the steps of:
    applying a first layer of silicon dioxide to said semiconductor substrate;
    applying a first layer of silicon nitride to said first layer of silicon dioxide;
    applying a second layer of silicon dioxide to said first layer of silicon nitride by low pressure CVD;
    selectively forming a first gate electrode on the surface of said second layer of silicon dioxide;
    thermally oxidizing the surface of said first gate electrode;
    selectively removing a portion of said second layer of silicon dioxide except under said first gate electrode;
    selectively removing a portion of said first layer of silicon nitride except under said first gate electrode;
    applying a second layer of silicon nitride to said first gate electrode and said first layer of silicon dioxide;
    applying a third layer of silicon dioxide to said second layer of silicon nitride by low pressure CVD; and
    selectively forming a second gate electrode on said third layer of silicon dioxide and adjacent to said first gate electrode, a portion of said second gate electrode lying over said first gate electrode.

4. A method according to claim 3 and wherein the thickness of said second layer of silicon nitride is substantially the same as that of said first layer of silicon nitride.

5. A method according to claim 4 and wherein the thickness of said third layer of silicon dioxide is substantially the same as that of said second layer of silicon dioxide.

* * * * *